(12) United States Patent
Song et al.

(10) Patent No.: US 9,547,209 B2
(45) Date of Patent: Jan. 17, 2017

(54) LIQUID CRYSTALLINE DISPLAY WITH ENHANCED DISPLAY QUALITY THEREOF AND A METHOD FOR MANUFACTURING THE SAME

(71) Applicant: Samsung Display Co., Ltd., Yongin (KR)

(72) Inventors: Dae Ho Song, Wanju-gun (KR); Ho Kyoon Kwon, Seoul (KR); Yu-Han Bae, Seoul (KR); Kee Byem Kim, Cheonan-si (KR); Yun Soo Kim, Asan-si (KR); Jae Hun Chung, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 83 days.

(21) Appl. No.: 14/321,027

(22) Filed: Jul. 1, 2014

(65) Prior Publication Data
US 2015/0009443 A1 Jan. 8, 2015

(30) Foreign Application Priority Data

Jul. 2, 2013 (KR) .......................... 10-2013-0077230

(51) Int. Cl.
*G02F 1/1343* (2006.01)
*G02F 1/136* (2006.01)
*H01L 27/12* (2006.01)

(52) U.S. Cl.
CPC ........... *G02F 1/136* (2013.01); *H01L 27/1248* (2013.01); *G02F 2001/13606* (2013.01)

(58) Field of Classification Search
CPC .................... G02F 1/136286; G02F 1/136227; G02F 1/134336; G02F 1/133707; G02F 1/1393; G02F 1/134309; G02F 1/134363; G02F 2001/134345
(Continued)

(56) References Cited

U.S. PATENT DOCUMENTS 6,710,372 B2 * 3/2004 Kim .................... G02F 1/13624
257/72
8,373,833 B2 2/2013 Song et al.
(Continued)

FOREIGN PATENT DOCUMENTS

KR 1020090091250 8/2009
KR 1020110048333 5/2011
(Continued)

*Primary Examiner* — Mike Qi
(74) *Attorney, Agent, or Firm* — Cantor Colburn LLP

(57) ABSTRACT

A liquid crystal display includes: an insulating substrate; gate lines and data lines disposed on the insulating substrate; pixels disposed on the substrate substantially in a matrix form, each pixel including a thin film transistor connected to a corresponding gate line of the gate lines and a corresponding data line of the data lines, a first electrode disposed on the thin film transistor, and a second electrode disposed on the first electrode; a first insulating layer disposed on the gate lines, the data lines and the thin film transistor, and under the first electrode; and a second insulating layer disposed between the first electrode and the second electrode, in which each of the first insulating layer and the second insulating layer include an inorganic insulating layer, and a thickness of the first insulating layer is greater than a thickness of the second insulating layer.

12 Claims, 12 Drawing Sheets

(58) Field of Classification Search
USPC .................. 349/143, 144, 146, 145, 141
See application file for complete search history.

(56) References Cited

U.S. PATENT DOCUMENTS

| | | | |
|---|---|---|---|
| 8,379,177 B2 | 2/2013 | Jung et al. | |
| 8,730,422 B2* | 5/2014 | Park | G02F 1/134363 349/143 |
| 2002/0044227 A1* | 4/2002 | Lee | G02F 1/134363 349/40 |
| 2003/0133066 A1* | 7/2003 | Ono | G02F 1/134363 349/141 |
| 2005/0231455 A1* | 10/2005 | Moon | G09G 3/3648 345/89 |
| 2005/0243044 A1* | 11/2005 | Kang | G02F 1/136286 345/87 |
| 2006/0231838 A1* | 10/2006 | Kim | G02F 1/136213 257/59 |
| 2008/0024712 A1* | 1/2008 | Kim | G02F 1/13338 349/144 |
| 2009/0152554 A1* | 6/2009 | Cho | H01L 27/1229 257/59 |
| 2010/0230680 A1* | 9/2010 | Seong | G02F 1/134363 257/59 |
| 2011/0102309 A1* | 5/2011 | Cho | G09G 3/3648 345/92 |
| 2011/0149186 A1 | 6/2011 | Song et al. | |
| 2011/0310035 A1* | 12/2011 | Kim | G06F 3/044 345/173 |
| 2011/0310340 A1* | 12/2011 | Nakamura | G02F 1/136209 349/140 |
| 2012/0146889 A1* | 6/2012 | Kwak | G02F 1/134363 345/88 |
| 2012/0280236 A1 | 11/2012 | Kim | |
| 2012/0280237 A1 | 11/2012 | Kwack et al. | |
| 2013/0001579 A1 | 1/2013 | Jung et al. | |
| 2013/0293820 A1* | 11/2013 | Lee | G02F 1/134336 349/143 |
| 2013/0314658 A1* | 11/2013 | Park | G02F 1/134363 349/147 |
| 2014/0118673 A1* | 5/2014 | Park | G02F 1/133345 349/138 |
| 2014/0167032 A1* | 6/2014 | Jo | H01L 27/124 257/43 |

FOREIGN PATENT DOCUMENTS

| | | |
|---|---|---|
| KR | 1020120107269 | 10/2012 |
| KR | 1020120132853 | 12/2012 |
| KR | 1020120136239 | 12/2012 |

* cited by examiner

LIQUID CRYSTALLINE DISPLAY WITH ENHANCED DISPLAY QUALITY THEREOF AND A METHOD FOR MANUFACTURING THE SAME

This application claims priority to Korean Patent Application No. 10-2013-0077230, filed on Jul. 2, 2013, and all the benefits accruing therefrom under 35 U.S.C. §119, the content of which in its entirety is herein incorporated by reference.

BACKGROUND (a) Field

Exemplary embodiments of the invention relate to a liquid crystal display.

(b) Description of the Related Art

A liquid crystal display, which is one of the most widely used types of flat panel display, is a display which applies voltage to an electrode to realign liquid crystal molecules of a liquid crystal layer, thereby controlling an amount of transmitted light to display an image.

In such a liquid crystal display, various types of liquid crystal alignments and various driving methods for improving side visibility have been developed. In such a liquid crystal display, a pixel electrode and a common electrode may be disposed on a single substrate to implement the wide viewing angle.

As a resolution of the liquid crystal display increases, the number of pixels increases, and thus the number of data lines increases. Therefore, in the liquid crystal display having a high resolution, the number of data driving units increases such that manufacturing cost of the liquid crystal display increases.

In such a liquid crystal display, coupling between adjacent pixels may occur due to a data voltage and a pixel voltage, and a capacity of a storage capacitor within a pixel may be increased to reduce a kickback voltage.

SUMMARY

Exemplary embodiments of the invention relate to a liquid crystal display which is driven at a low driving voltage to reduce manufacturing cost of a data driving unit and enhance a display quality thereof.

According to an exemplary embodiment of the invention, a liquid crystal display includes: an insulating substrate; a plurality of gate lines disposed on the insulating substrate; a plurality of data lines disposed on the insulating substrate; a plurality of pixels disposed on the substrate substantially in a matrix form including a plurality of pixel columns and a plurality of pixel rows, where each pixel includes: a thin film transistor connected to a corresponding gate line of the gate lines and a corresponding data line of the data lines; a first electrode disposed on the thin film transistor; and a second electrode disposed on the first electrode; a first insulating layer disposed on the gate lines, the data lines and the thin film transistor of each pixel, and under the first electrode of the each pixel; and a second insulating layer disposed between the first electrode and the second electrode of each pixel, in which each of the first insulating layer and the second insulating layer include an inorganic insulating layer, and a thickness of the first insulating layer is greater than a thickness of the second insulating layer.

In an exemplary embodiment, the second electrode may overlap the corresponding data line.

In an exemplary embodiment, a first contact hole may be defined in the second insulating layer, where the first contact hole exposes the first electrode of a pixel, a second contact hole may be defined in the first insulating layer and the second insulating layer, where the second contact hole exposes a drain electrode of the thin film transistor of the pixel, and the liquid crystal display may further include a connecting member disposed on the first contact hole and the second contact hole.

In an exemplary embodiment, the liquid crystal display may further include a common voltage line disposed on the insulating substrate, in which each data line may correspond to two adjacent pixel columns of the pixel columns, and the common voltage line extends substantially parallel to the data lines and is disposed between two data lines of the data lines adjacent to each other.

In an exemplary embodiment, the first insulating layer and the second insulating layer may be disposed on the common voltage line, a third contact hole may be defined in the first insulating layer and the second insulating layer, where the third contact hole exposes a portion of the common voltage line, and the second electrode may be connected to the common voltage line through the third contact hole.

In an exemplary embodiment, the second electrode may include a plurality of branch electrodes, and the branch electrodes may extend substantially parallel to the data lines.

In an exemplary embodiment, the second electrode may include a plurality of branch electrodes, and the branch electrodes may form a predetermined angle to the gate lines and extend substantially in a direction in which the gate lines extend.

In an exemplary embodiment, the first electrode may overlap the corresponding data line.

In an exemplary embodiment, an opening may be defined in the first electrode of a pixel at a portion corresponding to a drain electrode of the thin film transistor of the pixel, a first contact hole may be defined in the first insulating layer and the second insulating layer, where the first contact hole exposes a drain electrode of the thin film transistor of the pixel, the second electrode of the pixel may be connected to the drain electrode of the pixel through the first contact hole, and the first contact hole may be within the opening.

In an exemplary embodiment, the liquid crystal display may further include a common voltage line disposed on the insulating substrate, in which each data line may correspond to two adjacent pixel columns of the pixel columns, and the common voltage line extends substantially parallel to the data lines and is disposed between two data lines adjacent to each other.

In an exemplary embodiment, the first insulating layer and the second insulating layer may be disposed on the common voltage line, a second contact hole may be defined in the first insulating layer, where the second contact hole exposes a portion of the common voltage line, and the first electrode may be connected to the common voltage line through the second contact hole.

According to exemplary embodiments of the invention as described herein, the liquid crystal display may be driven at a low driving voltage to enhance the display quality of the liquid crystal display without increasing the manufacturing cost of the data driving unit.

BRIEF DESCRIPTION OF THE DRAWINGS

The above and other features of the invention will become more apparent by describing in detail exemplary embodiments thereof with reference to the attached drawings, in which.

DETAILED DESCRIPTION OF THE EMBODIMENTS

Figure 1:
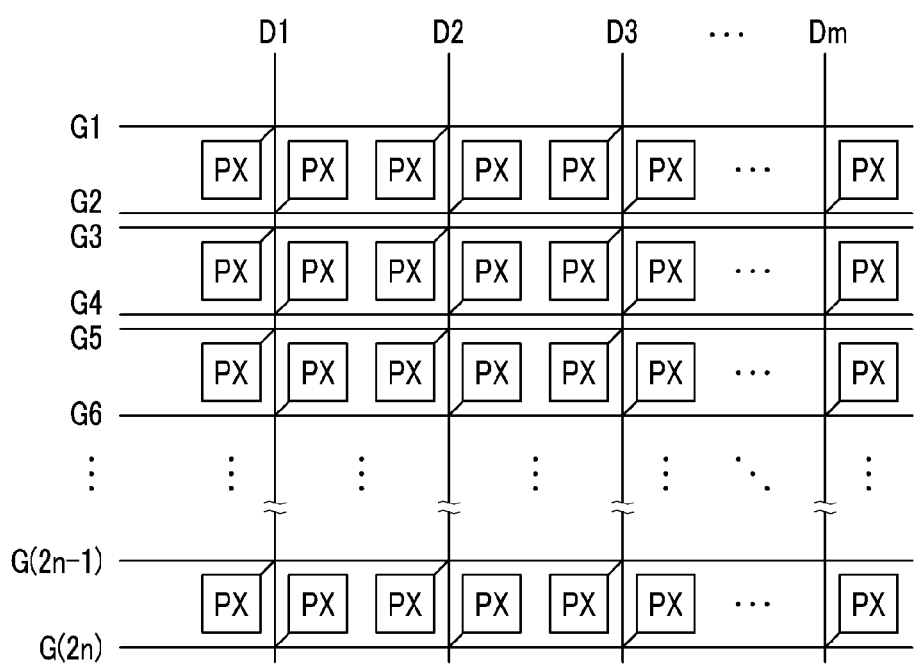
FIG. 1 is a block diagram illustrating arrangement of signal lines and pixels of an exemplary embodiment of a liquid crystal display according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

First, arrangement of signal lines and pixels of an exemplary embodiment of a liquid crystal display according to the invention will be described with reference to FIG. 1.

FIG. 1 is a block diagram illustrating the arrangement of signal lines and pixels of an exemplary embodiment of a liquid crystal display according to the invention.

Referring to FIG. 1, an exemplary embodiment of the liquid crystal display according to the invention includes a plurality of display signal lines G1 to G2n and D1 to Dm and a plurality of pixels PXs which is connected to the display signal lines and arranged substantially in a matrix form.

The display signal lines G1 to G2n and D1 to Dm include a plurality of gate lines G1 to G2n which transfers gate signals (referred to as a "scanning signal") and a plurality of data lines D1 to Dm which transfers data signals. The gate lines G1 to G2n extend substantially in a row direction and are substantially parallel to each other, and the data lines D1 to Dm extend substantially in a column direction and are substantially parallel to each other.

In an exemplary embodiment, as shown in FIG. 1, each pair of the gate lines G2i−1 and G2i (i=1, 2, . . . , n) is disposed in upper and lower portions of pixel PXs of a corresponding row and alternately connected to the pixels of the corresponding row, and each data line Dj (j=1, 2, 3, . . . , m) is disposed between pixels PX of two columns, and alternately connected to pixels PXs disposed at left and right sides thereof. In such an embodiment, pixels PX of a row connected to a same data line D1 to Dm is alternately connected to a corresponding pair of gate lines G2i−1 and G2i. The pixels PX of a column is connected to an adjacent data line Dj and is connected to gate lines disposed in a same portion thereof, e.g., either gate lines G2i−1 disposed in the upper portions thereof or gate lines G2i disposed in the lower portion thereof. In one exemplary embodiment, for example, the pixels PX connected to a same data line of the data lines D1, D2, D3, . . . , and disposed at the left side of the same data line is connected to the gate lines G1, G3, G5, . . . , disposed in the upper portion thereof, and the pixels PX connected to a same data line of the data lines D1, D2, D3, . . . , and disposed at the right side of the same data line gate lines G2, G4, G6, . . . in the lower portion thereof. In such an embodiment, as shown in FIG. 1, a (2k−1)-th pixel (k=1, 2, . . . , m/2) in a pixel row is connected to a (2i−1)-th gate line G2i−1 and a k-th data line Dk, and a 2k-th pixel in the pixel row is connected to a (2i)-th gate line G2i and a k-th data line Dk. In an alternative exemplary embodiment, the (2k−1)-th pixel (k=1, 2, . . . , m/2) in a pixel row may be connected to the (2i)-th gate line G2i and the k-th data line Dk, and the 2k-th pixel in the pixel row may be connected to the (2i−1)-th gate line G2i−1 and the k-th data line Dk.

In such an embodiment, the number of the data lines D1, D2, D3, . . . may be reduced to half the number of the pixel columns, such that manufacturing cost of a data driving unit may be reduced, and thus manufacturing cost of the liquid crystal display may be reduced.

Next, an exemplar embodiment of the liquid crystal display according to the invention will be described in greater detail with reference to FIGS. 2 to 4.

Figure 2:
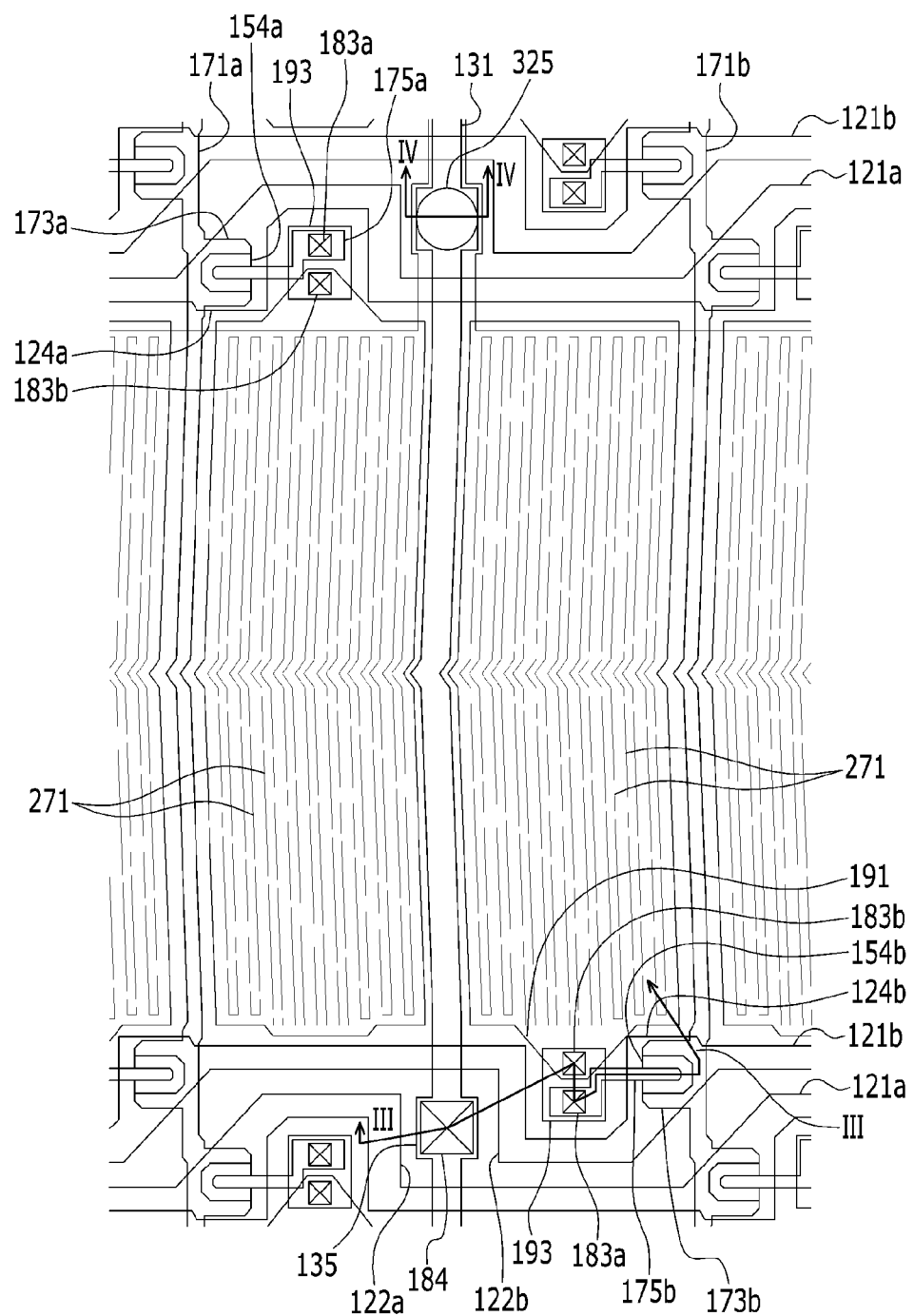
FIG. 2 is a plan view of a portion of pixels of an exemplary embodiment of the liquid crystal display according to the invention.
Figure 3:
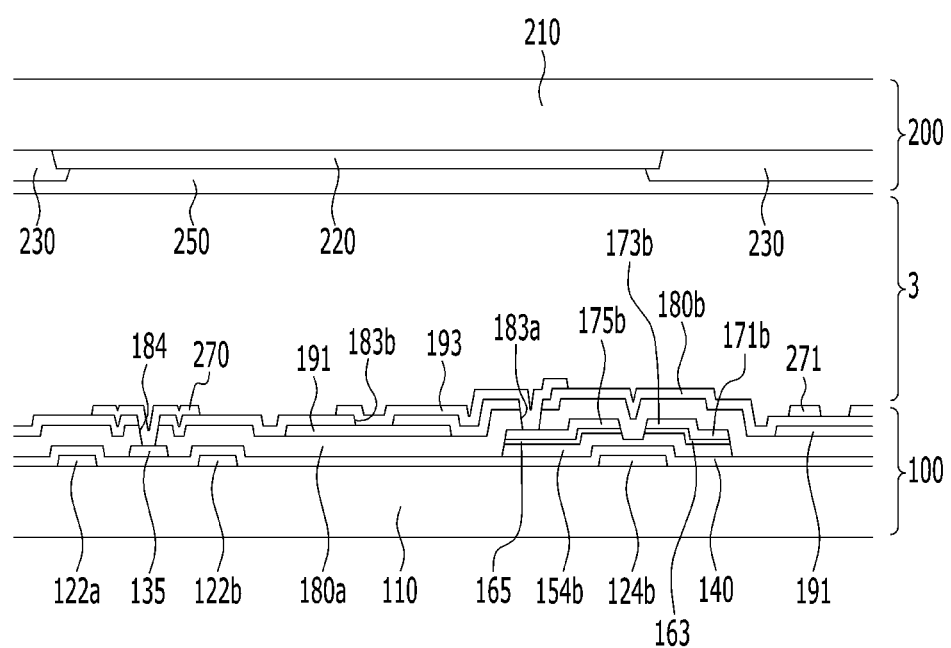
FIG. 3 is a cross-sectional view taken along line III-III of the liquid crystal display of FIG. 2.
Figure 4:
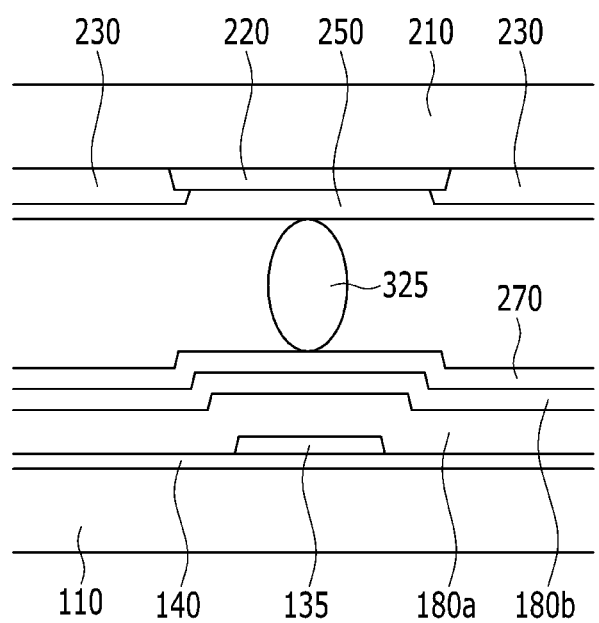
FIG. 4 is a cross-sectional view taken along line IV-IV of the liquid crystal display of FIG. 2.

FIG. 2 is a plan view of a portion of pixels of an exemplary embodiment of the liquid crystal display according to the invention, FIG. 3 is a cross-sectional view taken along line III-Ill of the liquid crystal display of FIG. 2, and FIG. 4 is a cross-sectional view taken along line IV-IV of the liquid crystal display of FIG. 2.

Referring to FIGS. 2 to 4, an exemplary embodiment of the liquid crystal display according to the invention includes a lower panel 100, an upper panel 200 disposed opposite to the lower panel 100, and a liquid crystal layer 3 interposed between the lower and upper panels 100 and 200.

In such an embodiment, the lower panel 100 includes a first insulation substrate 110 including a transparent material, e.g., glass or plastic. In such an embodiment, a plurality of gate lines 121a and 121b is disposed on the first insulation substrate 110.

In such an embodiment, a pair of gate lines 121a and 121b are connected to the pixels in a pixel row, and includes a first gate line 121a disposed in an upper portion of the pixel row and a second gate line 121b disposed in a lower portion of the pixel row. The first gate line 121a of the pixel row is disposed adjacent to the second gate line 121b of a previous pixel row, and the second gate line 121b of the pixel row is disposed adjacent to the first gate line 121a of a next pixel row. In such an embodiment, the first gate line 121a and the second gate line 121b which are connected to a current pixel row neighbor the second gate line 121b of a previous pixel row and the first gate line 121a of a next pixel row, respectively.

The first gate line 121a includes a first gate electrode 124a, and the second gate line 121b includes a second gate electrode 124b. The first gate line 121a includes a first vertical part 122a, and the second gate line 121b includes a second vertical part 122b.

A gate insulating layer 140 is disposed on the gate lines 121a and 121b and a pixel electrode 191. The gate insulating layer 140 may include an insulating material, such as an inorganic insulating material, e.g., silicon nitride ($SiN_x$) or silicon oxide ($SiO_x$).

A plurality of semiconductors 154a and 154b including a first semiconductor 154a and a second semiconductor 154b is disposed on the gate insulating layer 140. The semiconductors 154a and 154b may include an oxide semiconductor. The first semiconductor 154a and the second semiconductor 154b may be connected to each other.

A plurality of ohmic contacts 163 and 165 is disposed on the semiconductors 154a and 154b. The ohmic contacts 163 and 165 disposed on the semiconductors 154a and 154b disposed are opposite to each other based on the gate electrodes 124a and 124b. The ohmic contacts 163 and 165 may include a material, such as n+ hydrogenated amorphous silicon, which is doped with an n-type impurity, e.g., phosphorous, at a high concentration, or may include silicide. In an exemplary embodiment, where the semiconductors 154a and 154b includes an oxide semiconductor, the ohmic contacts 163 and 165 may be omitted. In such an embodiment, where the semiconductors 154a and 154b includes an oxide semiconductor, a barrier layer (not shown) and a capping layer (not shown) may be disposed on and beneath the semiconductors 154a and 154b.

Data conductors including a plurality of data lines 171a and 171b, a plurality of drain electrodes 175a and 175b, and a plurality of common voltage lines 131 are disposed on the ohmic contacts 163 and 165.

The data lines 171a and 171b transfer data signals, and extend substantially in a vertical direction crossing the gate lines 121a and 121b. The data lines 171a and 171b include a first data line 171a and a second data line 171b, between which two adjacent pixel columns are disposed. In an exemplary embodiment, the data lines 171a and 171b may have a bent portion having a bent shape to obtain a maximum transmittance of the liquid crystal display, and the bent portion of the data lines 171a and 171b may have a V-like shape at a middle portion of a pixel area.

Each of the data lines 171a and 171b is disposed between two adjacent pixel columns, each of the data lines 171a and 171b is alternately connected to pixel electrodes 191 of the pixels of two adjacent pixel columns, e.g., alternately connected to the pixel electrodes 191 disposed at the left and right sides thereof. In such an embodiment, each of the data lines 171a and 171b applies a data voltage to the pixel electrodes 191 of the two adjacent pixel columns, thereby reducing the number of the data lines 171a and 171b by half the number of the pixel columns. Therefore, in such an embodiment, the manufacturing cost of the liquid crystal display may be reduced.

The first data line 171a includes a first source electrode 173a which extends toward the first gate electrode 124a, and the second data line 171b includes a second source electrode 173b which extends toward the second gate electrode 124b.

The first drain electrode 175a includes one end (e.g., a first end) facing the first source electrode 173a based on the first gate electrode 124a and the other end (e.g., the second end) having a wide area.

The second drain electrode 175b includes one end (e.g., a first end) facing the second source electrode 173b based on the second gate electrode 124b and the other end (e.g., the second end) having a wide area.

The common voltage line 131 is disposed between two data lines 171a and 171b, and extends substantially parallel to the data lines 171a and 171b. The common voltage line 131 includes a plurality of extensions 135. The common voltage line 131 may include a bent portion having a bent shape corresponding to the bent portion of the data lines 171a and 171b, and the bent portion of the common voltage line 131 may have a V-like shape at the middle portion of a pixel area.

The extension 135 of the common voltage line 131 is disposed between the vertical parts 122a and 122b of the first gate line 121a and the second gate line 121b.

In such an embodiment, an area occupied by the gate lines 121a and 121b and the extension 135 of the common voltage line 131 is substantially reduced by providing, e.g., disposing, the extension 135 of the common voltage line 131 between the vertical parts 122a and 122b of the first gate line 121a and the second gate line 121b.

The first and second gate electrodes 124a and 124b, the first and second source electrodes 173a and 173b, and the first and second drain electrodes 175a and 175b collectively defines a thin film transistor ("TFT"), which is a switching element, along with the first and second semiconductors 154a and 154b. The semiconductors 154a and 154b may have substantially the same planar shape as an overall shape of the data lines 171a and 171b, the drain electrodes 175a and 175b, and the ohmic contacts 163 and 165 below the drain electrodes 175a and 175b, except for a channel region of the TFT.

A first passivation layer 180a is disposed on the data conductors 171a, 171b, 175a, 175b and 131 and an exposed portion of the semiconductors 154a and 154b. The first passivation layer 180a may include an inorganic insulating material.

The pixel electrode 191 is disposed on the first passivation layer 180a.

The pixel electrode 191 may have a planar shape corresponding to a shape of a pixel area. An overall shape of the pixel electrode 191 may be substantially polygonal, which has a side substantially parallel to the gate lines 121a and 121b, the data lines 171a and 171b, and the common voltage line 131. The pixel electrode 191 may include a transparent conductive material, such as indium tin oxide ("ITO") and indium zinc oxide ("IZO"), for example.

A second passivation layer 180b is disposed on the pixel electrode 191. The second passivation layer 180b may include an inorganic insulating material.

A common electrode 270 is disposed on the second passivation layer 180b. The common electrode 270 may include a transparent conductive material, such as ITO and IZO, for example.

The common electrode 270 includes a plurality of branch electrodes 271 and is connected to an adjacent common electrode 270 of an adjacent pixel area.

The branch electrodes 271 of the common electrode 270 extend substantially parallel to the data lines 171a and 171b and the common voltage line 131.

A first contact hole 183a is defined in or through the first passivation layer 180a and the second passivation layer 180b, and the first contact hole 183a exposes a portion of the drain electrodes 175a and 175b. A second contact hole 183b is defined in or through the second passivation layer 180b, and the second contract hole 183b exposes a portion of the pixel electrode 191.

A portion of the drain electrodes 175a and 175b exposed by the first contact hole 183a is connected on a portion of the pixel electrode 191 exposed by the second contact hole 183b by a connecting member 193, such that the pixel electrode 191 receives the data voltage from the drain electrodes 175a and 175b.

In an alternative exemplary embodiment of a liquid crystal display according to the invention, the first contact hole 183a and the second contact hole 183b may collectively define a single contact hole. In such an embodiment, the single contact hole exposes both a portion of the drain electrodes 175a and 175b and a portion of the pixel electrode 191.

A third contact hole 184 may be defined in or through the first passivation layer 180a and the second passivation layer 180b, and the third contact hole 184 exposes a portion of the extension 135 of the common voltage line 131, and the common electrode 270 is physically and electrically connected to the common voltage line 131 through the third contact hole 184 and receives a common voltage therefrom.

The pixel electrode 191 applied with the data voltage generates an electric field in the liquid crystal layer 3, along with the common electrode 270 applied with the common voltage.

The branch electrodes 271 of the common electrode 270 overlap the pixel electrode 191 which has a planar shape.

In an exemplary embodiment of the liquid crystal display according to the invention, the third contact hole 184 that exposes the common voltage line 131 does not overlap the gate lines 121a and 121b, such that the third contact hole 184 is spaced apart from the gate lines 121 and 121b, and the gate lines 121a and 121b and the common voltage line 131 are thereby effectively prevented from being short-circuited due to a penetration of static electricity, which may occur in a process of forming the third contact hole 184, into the gate insulating layer 140.

In an exemplary embodiment, the extension 135 of the common voltage line 131 does not to overlap the gate lines 121a and 121b such that a step is effectively prevented from being formed in the extension 135 of the common voltage line 131, and the third contact hole 184 is thereby substantially symmetrically formed without a difference in height. In such an embodiment, reliability of the physical and electrical connection between the common voltage line 131 and the common electrode 270 through the third contact hole 184 is substantially increased.

According to an exemplary embodiment of the liquid crystal display according to the invention, each of the first passivation layer 180a and the second passivation layer 180b includes an inorganic insulating material.

In such an embodiment, a thickness of the first passivation layer 180a disposed between the data lines 171a and 171b and the pixel electrode 191 is greater than a thickness of the second passivation layer 180b, such that a coupling between the data lines 171a and 171b and the pixel electrode 191 is substantially reduced or effectively prevented.

In a conventional liquid crystal display, the coupling between data lines and a pixel electrode is typically reduced by a passivation layer provided therebetween as an organic film. In such a conventional liquid crystal display, the manufacturing cost is relatively high, an aperture ratio of the liquid crystal display may be relatively low, and an additional process may be performed to remove the organic film from a driving unit thereof.

In an exemplary embodiment of the liquid crystal display of the exemplary embodiment of the invention, the first passivation layer 180a including the inorganic insulating material is disposed between the data lines 171a and 171b and the pixel electrode 191 which is a field generating electrode, thereby substantially reducing the coupling between the data lines 171a and 171b and the pixel electrode 191, while reducing the manufacturing cost and effectively preventing the aperture ratio of the liquid crystal display from being decreased.

In an exemplary embodiment, the second passivation layer 180b which is disposed between the pixel electrode 191 and the common electrode 270, which are the two field generating electrodes, has a thin thickness, thereby increasing the difference in voltage between the pixel electrode 191 and the common electrode 270 with the data voltage having a relatively low magnitude, which is applied to the pixel electrode 191, such that the liquid crystal display is effectively prevented from being damaged due to heat which may occur by a data voltage having high magnitude, and manufacturing cost of the driving unit is substantially reduced.

In such an embodiment of the liquid crystal display, the common electrode 270 is disposed over substantially an entire surface of the first insulating substrate 110. Therefore, an overlapping area between the common electrode 270 and the pixel electrode 191 increases such that the storage capacitance of the liquid crystal display is increased, and a kickback voltage of the liquid crystal display is thereby reduced. In such an embodiment, where the common electrode 270 is disposed over substantially an entire surface of the first insulating substrate 110, an effect due to a difference in the overlapping area between the data lines 171 and 171b and the pixel electrode 191, e.g., the coupling change which may occur due to the difference in the overlapping area between the data lines 171a and 171b and the pixel electrode 191, is effectively prevented such that an image quality is substantially improved.

In an exemplary embodiment, a first alignment layer (not illustrated) is disposed on an inner surface of the lower panel 100.

In an exemplary embodiment, the upper panel 200 includes a second insulating substrate 210 including a transparent material, such as glass or plastic, for example.

A light blocking member 220 is disposed on the second insulating substrate 210. The light blocking member 220 effectively prevents light leakage and may be referred to as a black matrix.

A plurality of color filters 230 is disposed on the second insulating substrate 210. The color filter 230 covers substantially an entire region enclosed by the light blocking member 220, and may extend substantially in a vertical direction along the pixel electrode 191 column. Each color filter 230 may display one of the primary colors, such as three primary colors of red, green and blue, for example, but not being limited thereto. In an alternative exemplary embodiment, the primary colors may include the three primary colors of yellow, cyan and magenta, for example. In an alternative exemplary embodiment, each color filter 230 may display a mixed color of the primary colors or white.

An overcoat 250 may be disposed on the color filter 230 and the light blocking member 220. The overcoat 250 may include an insulating material, e.g., an organic insulating material. The overcoat 250 effectively prevents the color filter 230 from being exposed and provides a flat surface. In an alternative exemplary embodiment, the overcoat 250 may be omitted.

A second alignment layer (not illustrated) may be disposed on an inner surface of the upper panel 200.

A spacer 325 is disposed between the lower panel 100 and the upper panel 200. The spacer 325 is disposed at a position overlapping a portion of the extensions 135 of the common voltage line 131.

The third contact hole 184 for electrically connecting between the common voltage line 131 and the common electrode 270 is not defined on an overlapping portion of the extensions 135 of the common voltage line 131 and the spacer 325.

In such an embodiment, a common contact hole for electrically connecting between the common voltage line 131 and the common electrode 270 is not disposed at a position at which the spacer 325 is disposed, such that a step of a lower layer of the spacer 325 is reduced, and the spacer 235 is thereby stably maintained in a position thereof between the lower panel 100 and the upper panel 200. In such an embodiment, the spacer 325 does not overlap the gate lines 121a and 121b such that the step of the lower layer of the spacer 325 is reduced, and the spacer 325 is thereby stably maintained in a position thereof between the lower panel 100 and the upper panel 200.

In an exemplary embodiment of the liquid crystal display according to the invention, the spacer 325, which maintains an interval between the lower panel 100 and the upper panel 200, is disposed at a position at which the spacer 325 overlaps a portion of the extensions 135 of the common voltage line 131, such that an additional light blocking member is not disposed on the spacer 325 to prevent light leakage, and the aperture ratio of the liquid crystal display is thereby effectively from deteriorating by the additional light blocking member.

The liquid crystal layer 3 interposed between the lower panel 100 and the upper panel 200 includes liquid crystal molecules (not illustrated), a longitudinal axes of which are aligned substantially horizontal with respect to a surface of the lower and upper panels 100 and 200 in a state where no electric field is applied thereto.

The liquid crystal layer 3 may have a positive dielectric anisotropy or a negative dielectric anisotropy. The liquid crystal molecules of the liquid crystal layer 3 may be aligned to have a line inclination in a predetermined direction, and the line inclination direction of the liquid crystal molecules may be determined based on the dielectric anisotropy of the liquid crystal layer 3.

A backlight unit (not illustrated), which generates and provide light to the lower and upper panels 100 and 200, may be further disposed outside the first insulating substrate 110 of the lower panel 100.

The pixel electrode 191 applied with the data voltage generates an electric field in the liquid crystal layer 3, along with the common electrode 270 applied with the common voltage, thereby determining the direction of the liquid crystal molecules of the liquid crystal layer 3 to display an image corresponding to the data voltage.

Next, an alternative exemplary embodiment of a liquid crystal display according to the invention will be described with reference to FIGS. 5 to 7.

Figure 5:
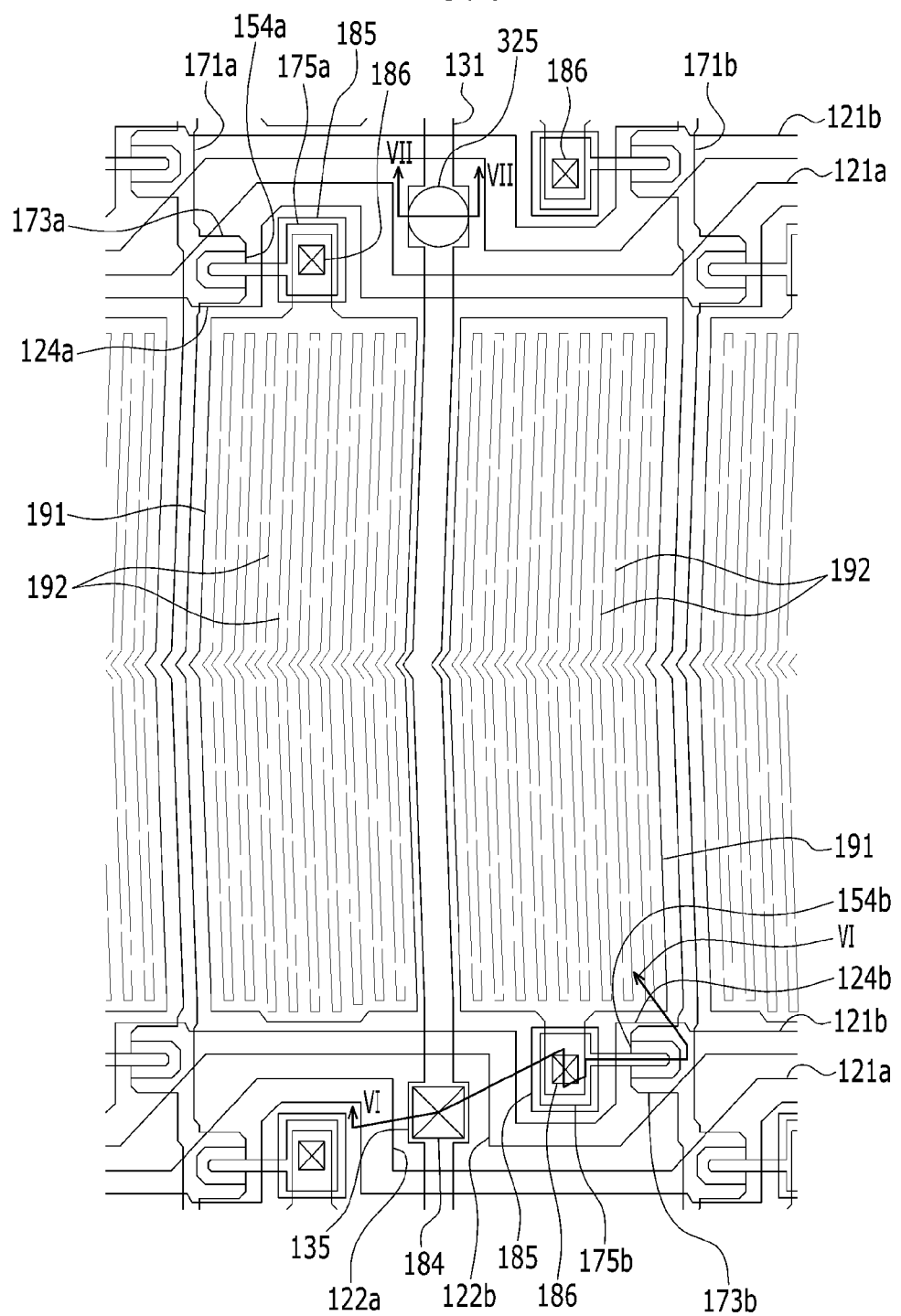
FIG. 5 is a plan view of a portion of pixels of an alternative exemplary embodiment of a liquid crystal display according to the invention.
Figure 6:
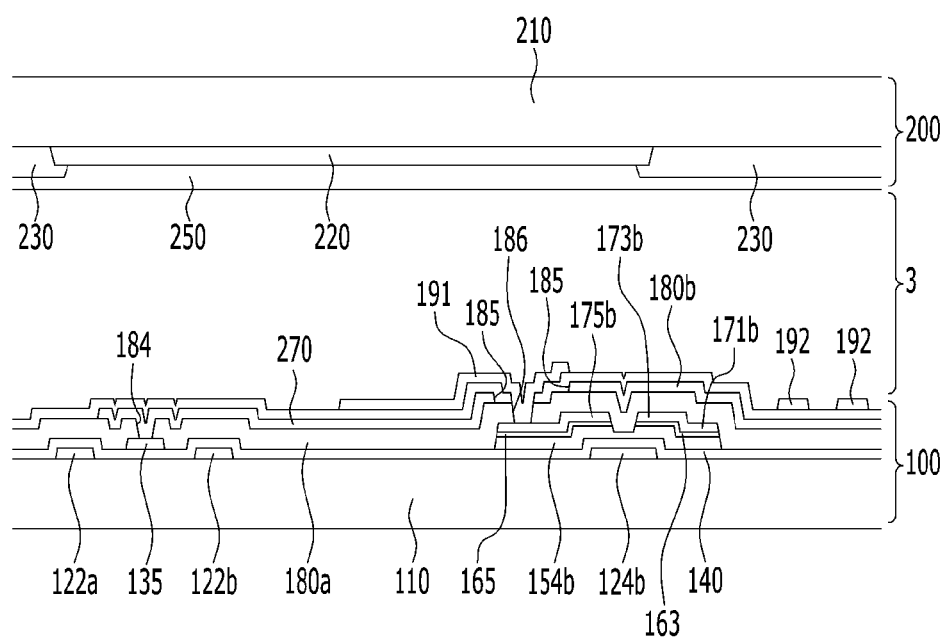
FIG. 6 is a cross-sectional view taken along line VI-VI of the liquid crystal display of FIG. 5.
Figure 7:
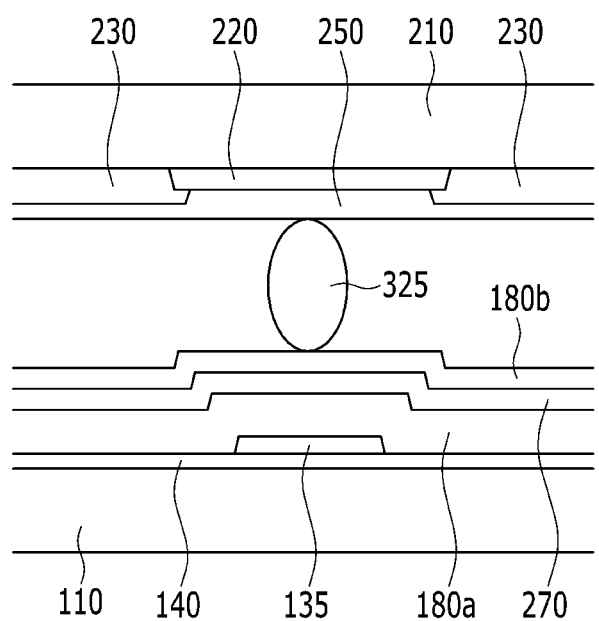
FIG. 7 is a cross-sectional view taken along line VII-VII of the liquid crystal display of FIG. 5.

FIG. 5 is a plan view of a portion of pixels of an alternative exemplary embodiment of a liquid crystal display according to the invention, FIG. 6 is a cross-sectional view taken along line VI-VI of the liquid crystal display of FIG. 5, and FIG. 7 is a cross-sectional view taken along line VII-VII of the liquid crystal display of FIG. 5.

The liquid crystal display shown in FIGS. 5 to 7 is substantially similar to the exemplary embodiment of the liquid crystal display shown in FIGS. 2 to 4. The same or like elements shown in FIGS. 5 to 7 have been labeled with the same reference characters as used above to describe the exemplary embodiments of the liquid crystal display in FIGS. 2 to 4, and any repetitive detailed description thereof may be omitted or simplified.

In an alternative exemplary embodiment, as shown in FIGS. 5 to 7, the liquid crystal display includes the lower and upper panel 100 and 200 opposite to each other and the liquid crystal layer 3 interposed between the lower and upper panels 100 and 200.

In such an embodiment, the gate lines 121a and 121b are disposed on the first insulating substrate 110 of the lower panel 100. The gate lines 121a and 121b is disposed in a pixel row, and includes the first gate line 121a disposed at an upper portion of the pixel row and the second gate line 121b disposed at a lower portion of the pixel row. The first gate line 121a is disposed to adjacent the second gate line 121b of the previous pixel row and the second gate line 121b is disposed adjacent to the first gate line 121a of the next pixel row. In such an embodiment, the first gate line 121a and the second gate line 121b which are connected to a current pixel row neighbor the second gate line 121b of a previous pixel row and the first gate line 121a of a next pixel row, respectively.

The first gate line 121a includes the first gate electrode 124a, and the second gate line 121b includes the second gate electrode 124b. The first gate line 121a includes the first vertical part 122a, and the second gate line 121b includes the second vertical part 122b.

The gate insulating layer 140 is disposed on the gate lines 121a and 121b.

The first semiconductor 154a and the second semiconductor 154b are disposed on the gate insulating layer 140. The ohmic contacts 163 and 165 are disposed on the semiconductors 154a and 154b.

The data conductors including the data lines 171a and 171b, the drain electrodes 175a and 175b, and the common voltage lines 131 are disposed on the ohmic contacts 163 and 165.

The data lines 171a and 171b transfer the data signals, and extend substantially in a vertical direction crossing the gate lines 121a and 121b. The data lines 171a and 171b include the first data line 171a and the second data line 171b, between which two adjacent pixel columns are disposed.

In an exemplary embodiment, the data lines 171a and 171b may have a bent portion having a bent shape to obtain a maximum transmittance of the liquid crystal display, and the bent portion of the data lines 171a and 171b may have a V-like shape at a middle portion of a pixel area.

Each of the data lines 171a and 171b is disposed between two adjacent pixel columns, each of the data lines 171a and 171b is alternately connected to pixel electrodes 191 of the pixels of two adjacent pixel columns, e.g., alternately connected to the pixel electrodes 191 disposed at the left and right sides thereof. In such an embodiment, each of the data lines 171a and 171b applies a data voltage to the pixel electrodes 191 of the two adjacent pixel columns, thereby reducing the number of the data lines 171a and 171b by half the number of the pixel columns. Therefore, the manufacturing cost of the liquid crystal display may be reduced.

The first data line 171a includes the first source electrode 173a which extends toward the first gate electrode 124a, and the second data line 171b includes the second source electrode 173b which extends toward the second gate electrode 124b.

The first drain electrode 175a includes one end facing the first source electrode 173a based on the first gate electrode 124a and the other end having a wide area.

The second drain electrode 175b includes one end facing the second source electrode 173b based on the second gate electrode 124b and the other end having a wide area.

The common voltage line 131 is disposed between the two data lines 171a and 171b and extends substantially parallel to the data lines 171a and 171b. The common voltage line 131 includes the extensions 135. The common voltage line 131 may include a bent portion having a bent shape corresponding to the bent portion of the data lines 171a and 171b, and the bent portion of the common voltage line 131 may have a V-like shape at the middle portion of a pixel area.

The extension 135 of the common voltage line 131 is disposed between the vertical parts 122a and 122b of the first gate line 121a and the second gate line 121b.

In such an embodiment, an area occupied by the gate lines 121a and 121b and the extension 135 of the common voltage line 131 is substantially reduced by providing, e.g., disposing, the extension 135 of the common voltage line 131 between the vertical parts 122a and 122b of the first gate line 121a and the second gate line 121b.

A contact hole 184 (also referred to as a second contact hole) may be defined in or through the first passivation layer 180a and the second passivation layer 180b, and the second contact hole 184 exposes a portion of the extension 135 of the common voltage line 131. In such an embodiment, the common voltage line 131 may include a first portion that overlaps the second contact hole 184, and a second portion that overlaps the spacer 325.

The first passivation layer 180a is disposed on the data conductors 171a, 171b, 175a, 175b and 131 and the exposed portion of the semiconductors 154a and 154b. The common electrode 270 is disposed on the first passivation layer 180a. The common electrode 270 may have a planar shape, e.g., a plate-like shape, and the common electrodes 270 disposed in the adjacent pixel areas may be connected to each other. The common electrode 270 may have an aperture region 185 (e.g., an opening) defined on the drain electrodes 175a and 175b.

The second passivation layer 180b is disposed on the common electrode 270.

The pixel electrode 191 is disposed on the second passivation layer 180b. The pixel electrode 191 includes a plurality of branch electrodes 192.

The branch electrodes 192 of the pixel electrode 191 extend substantially parallel to the data lines 171a and 171b and the common voltage line 131.

In such an embodiment, as described above, a contact hole that exposes an extension 135 of the common voltage line 131, that is, the second contact hole 184, is defined in or through the first passivation layer 180a.

The common electrode 270 is connected to the extension 135 of the common voltage line 131 through the second contact hole 184.

A contact hole (hereinafter, a first contact hole) 186 is defined in or through the first passivation layer 180a and the second passivation layer 180b.

The first contact hole 186 is defined within the aperture region 185 of the common electrode 270.

In such an embodiment, the first contact hole 186 may be simultaneously formed through the first passivation layer 180a and the second passivation layer 180b, and the first contact hole 186 formed in the first passivation layer 180a and the first contact hole 186 formed in the second passivation layer 180b are aligned to each other.

The pixel electrode 191 contacts the drain electrodes 175a and 175b through the first contact hole 186 in the first passivation layer 180a and the second passivation layer 180b.

The pixel electrode 191 applied with the data voltage generates an electric field in the liquid crystal layer 3, along with the common electrode 270 applied with the common voltage.

In such an embodiment, as shown in FIGS. 6 and 7, the thickness of the first passivation layer 180a disposed between the data lines 171a and 171b and the common electrode 270 is greater than the thickness of the second passivation layer 180b. In such an embodiment, the first passivation layer 180a has a relatively thick thickness, such that a coupling between the data lines 171a and 171b and the common electrode 270 is substantially reduced or effectively prevented.

As described above, in a conventional liquid crystal display, the coupling between data lines and a pixel electrode is typically reduced by a passivation layer provided therebetween as an organic film. In such a conventional liquid crystal display, the manufacturing cost is relatively high, an aperture ratio of the liquid crystal display may be relatively low, and an additional process for removing the organic film may be performed to remove the organic film from a driving unit thereof.

In an exemplary embodiment of the liquid crystal display of the invention, the first passivation layer 180a including the inorganic insulating material is disposed between the data lines 171a and 171b and the common electrode 270 which is a field generating electrode, thereby substantially reducing the coupling between the data lines 171a and 171b and the common electrode 270 and the pixel electrode 191, while reducing the manufacturing cost and effectively preventing the aperture ratio of the liquid crystal display from being decreased.

In an exemplary embodiment, the second passivation layer 180b which is disposed between the pixel electrode 191 and the common electrode 270, which are the two field generating electrodes, has a thin thickness, thereby increasing the difference in voltage between the pixel electrode 191 and the common electrode 270 with the data voltage having a relatively low magnitude, which is applied to the pixel electrode 191, such that the liquid crystal display is effectively prevented from being damaged due to heat which may occur by a data voltage having high magnitude, and manufacturing cost of the driving unit is substantially reduced.

In such an embodiment of the liquid crystal display according to the invention, the common electrode 270 is disposed over substantially an entire surface of the first insulating substrate 110. Therefore, the overlapping area between the common electrode 270 and the pixel electrode 191 increases, thereby increasing the storage capacitance of the liquid crystal display, such that the kickback voltage of the liquid crystal display is thereby reduced. In such an embodiment, where the common electrode 270 is disposed over substantially an entire surface of the first insulating substrate 110, an effect due to a difference in the overlapping area between the data lines 171 and 171b and the pixel electrode 191, e.g., the coupling change which may occur due to the difference in the overlapping area between the data lines 171a and 171b and the pixel electrode 191, is effectively prevented, such that an image quality is substantially improved.

Next, the upper panel 200 will be described. The light blocking member 220 is disposed on the second insulating substrate 210. The color filters 230 are disposed on the second insulating substrate 210. The color filter 230 may cover substantially an entire region enclosed by the light blocking member 220.

The overcoat 250 is disposed on the color filter 230 and the light blocking member 220. In an alternative exemplary embodiment, the overcoat 250 may be omitted.

The spacer 325 is disposed between the lower panel 100 and the upper panel 200. The spacer 325 is disposed at a position overlapping a portion of the extensions 135 of the common voltage line 131.

The second contact hole 184 for electrically connecting between the common voltage line 131 and the common electrode 270 is not disposed on a portion of the extensions 135 of the common voltage line 131 overlapping the spacer 325.

In such an embodiment, other features of the liquid crystal display are substantially the same as corresponding features of the exemplary embodiment described with reference to FIGS. 2 to 4.

Figure 8:
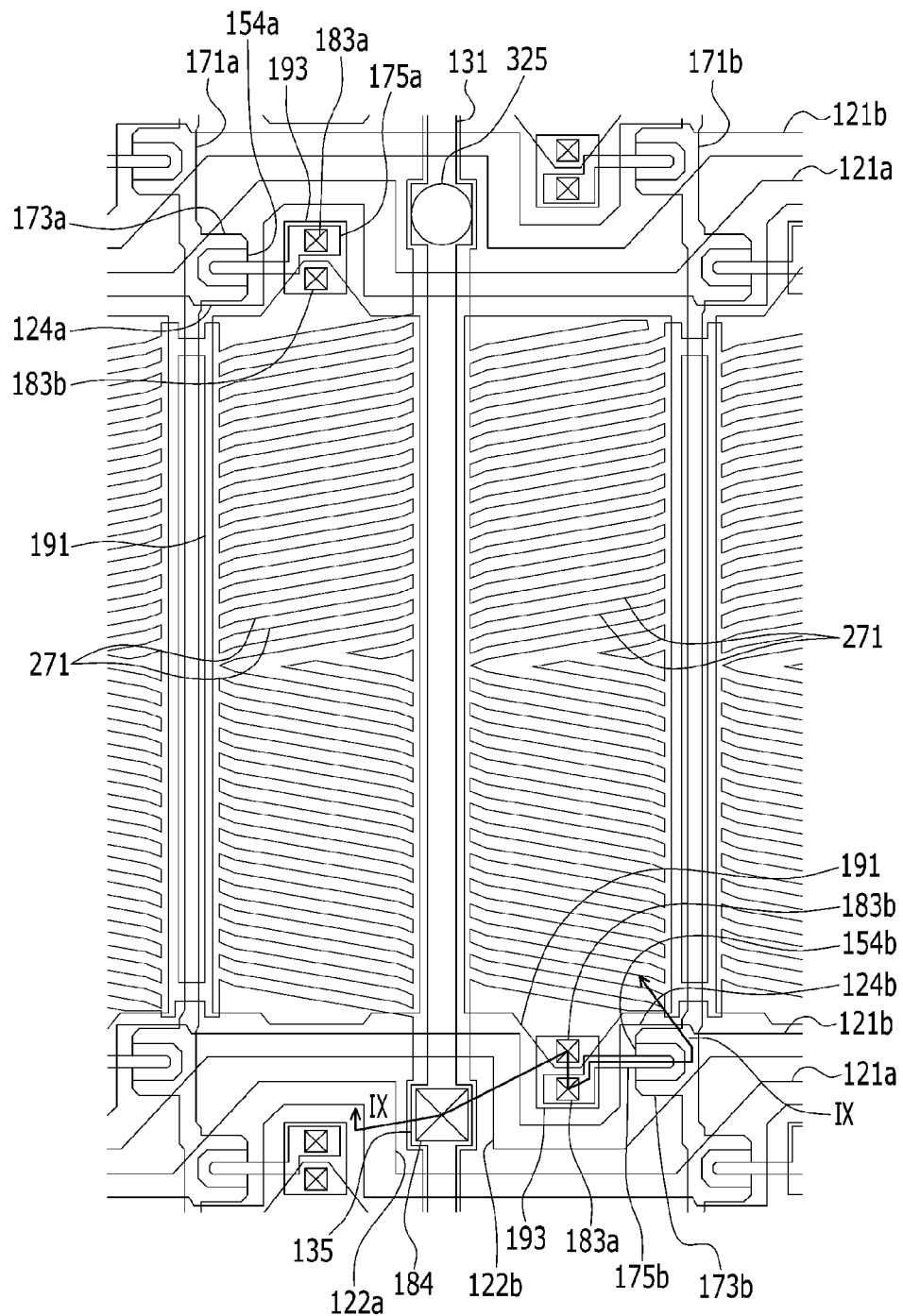
FIG. 8 is a plan view illustrating a portion of pixels of another alternative exemplary embodiment of a liquid crystal display according to the invention.

Next, another alternative exemplary embodiment of a liquid crystal display according to the invention will be described with reference to FIGS. 8 and 9. FIG. 8 is a plan view of a portion of pixels of another alternative exemplary embodiment of a liquid crystal display according to the invention, and FIG. 9 is a cross-sectional view taken along line IX-IX of the liquid crystal display of FIG. 8.

Figure 9:
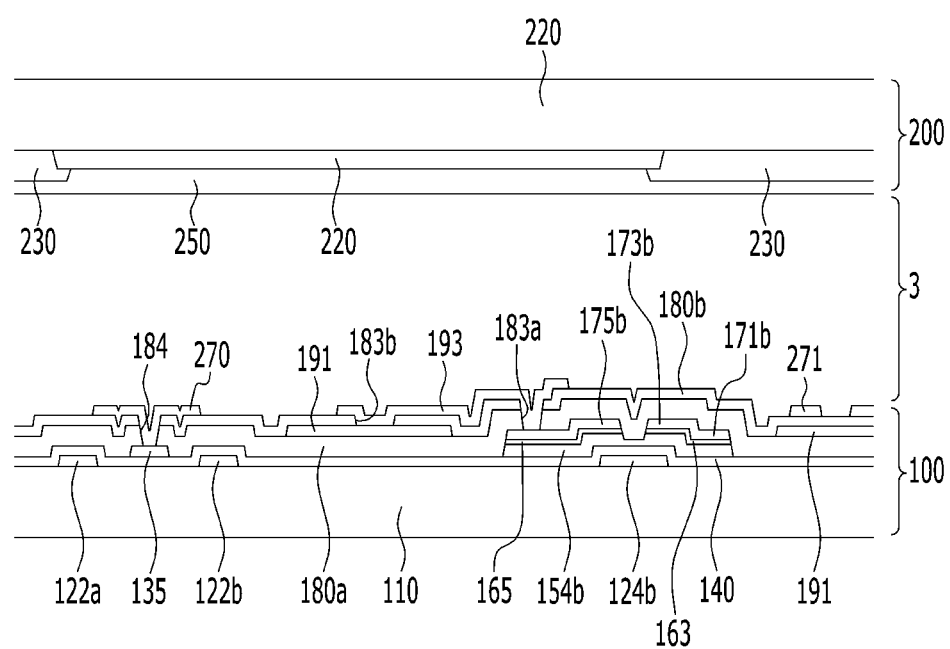
FIG. 9 is a cross-sectional view taken along line IX-IX of the liquid crystal display of FIG. 8.

The liquid crystal display shown in FIGS. 8 and 9 is substantially similar to the exemplary embodiment of the liquid crystal display according to the invention described with reference to FIGS. 2 to 4. The same or like elements shown in FIGS. 8 and 9 have been labeled with the same reference characters as used above to describe the exemplary embodiments of the liquid crystal display in FIGS. 2 to 4, and any repetitive detailed description thereof may be omitted or simplified.

Referring to FIGS. 8 and 9, another alternative exemplary embodiment of the liquid crystal display according to the invention includes the lower panel 100 and the upper panel 200 opposite to each other and the liquid crystal layer 3 interposed between the lower and upper panels 100 and 200.

First, the lower panel 100 will be described.

In an exemplary embodiment, the gate lines 121a and 121b are disposed on the first insulating substrate 110 of the lower panel 100. The gate lines 121a and 121b are disposed in a pixel row, and includes the first gate line 121a disposed at an upper portion of the pixel row and the second gate line 121b disposed at a lower portion of the pixel row. The first gate line 121a is disposed adjacent to the second gate line 121b of the adjacent pixel row, and the second gate line 121b is disposed adjacent to the first gate line 121a of the next pixel row. In such an embodiment, the first gate line 121a and the second gate line 121b which are connected to a current pixel row neighbor the second gate line 121b of a previous pixel row and the first gate line 121a of a next pixel row, respectively.

The first gate line 121a includes the first gate electrode 124a, and the second gate line 121b includes the second gate electrode 124b. The first gate line 121a includes the first vertical part 122a, and the second gate line 121b includes the second vertical part 122b.

The gate insulating layer 140 is disposed on the gate lines 121a and 121b.

The first semiconductor 154a and the second semiconductor 154b are disposed on the gate insulating layer 140. The ohmic contacts 163 and 165 are disposed on the semiconductors 154a and 154b.

The data conductors including the data lines 171a and 171b, the drain electrodes 175a and 175b, and the common voltage lines 131 are disposed on the ohmic contacts 163 and 165.

The data lines 171a and 171b transfer the data signals and extend substantially in a vertical direction crossing the gate lines 121a and 121b. The data lines 171a and 171b include the first data line 171a and the second data line 171b, between which two adjacent pixel columns are disposed.

In such an embodiment, the data lines 171a and 171b extend substantially linearly in a predetermined direction.

Each of the data lines 171a and 171b is disposed between two adjacent pixel columns, each of the data lines 171a and 171b is alternately connected to the pixel electrodes 191 of the pixels of two adjacent pixel columns, e.g., alternately connected to the pixel electrodes 191 disposed at the left and right sides thereof. In such an embodiment, each of the data lines 171a and 171b applies a data voltage to the pixel electrodes 191 of the two adjacent pixel, thereby reducing the number of the data lines 171a and 171b by half the number of the pixel columns. Therefore, the manufacturing cost of the liquid crystal display may be reduced.

The first data line 171a includes the first source electrode 173a which extends toward the first gate electrode 124a, and the second data line 171b includes the second source electrode 173b which extends toward the second gate electrode 124b.

The first drain electrode 175a includes one end facing the first source electrode 173a based on the first gate electrode 124a and the other end having a wide area.

The second drain electrode 175b includes one end facing the second source electrode 173b based on the second gate electrode 124b and the other end having a wide area.

The common voltage line 131 is disposed between the two data lines 171a and 171b and extends substantially parallel to the data lines 171a and 171b. The common voltage line 131 extends substantially linearly in a predetermined direction. In such an embodiment, an extending direction of the common voltage line 131 may be substantially parallel to an extending direction of the data lines 171a and 171b.

The extension 135 of the common voltage line 131 is disposed between the vertical parts 122a and 122b of the first gate line 121a and the second gate line 121b.

In such an embodiment, an area occupied by the gate lines 121a and 121b and the extension 135 of the common voltage line 131 is substantially reduced by providing, e.g., disposing, the extension 135 of the common voltage line 131 between the vertical parts 122a and 122b of the first gate line 121a and the second gate line 121b.

A contact hole 184 that exposes a portion of the extension 135 of the common voltage line 131 is defined in or through the first passivation layer 180a and the second passivation layer 180b. In such an embodiment, the common voltage line 131 may include a first portion that overlaps the contact hole 184, and a second portion that overlaps the spacer 325.

The first passivation layer 180a is disposed on the data conductors 171a, 171b, 175a, 175b, and 131 and the exposed portion of the semiconductors 154a and 154b. The pixel electrode 191 is disposed on the first passivation layer 180a. The pixel electrode 191 may have a planar shape, e.g., a plate-like shape which covers substantially an entire of a pixel area.

The second passivation layer 180b is disposed on the pixel electrode 191. The second passivation layer 180a may include an inorganic insulating material.

The common electrode 270 is disposed on the second passivation layer 180b. The common electrode 270 includes the branch electrodes 271 and is connected to the common electrode 270 disposed in an adjacent pixel.

The branch electrodes 271 of the common electrode 270 forms a predetermined angle with the gate lines 121a and 121b and extends substantially parallel to a extending direction of the gate lines 121a and 121b.

The first contact hole 183a that exposes a portion of the drain electrodes 175a and 175b is defined in or through the first passivation layer 180a and the second passivation layer 180b, and the second contact hole 183b that exposes a portion of the pixel electrode 191 is defined in or through the second passivation layer 180b.

A portion of the drain electrodes 175a and 175b exposed by the first contact hole 183a is connected to a portion of the pixel electrode 191 exposed by the second contact hole 183b by the connecting member 193, such that the pixel electrode 191 receives the data voltage from the drain electrodes 175a and 175b.

The pixel electrode 191 applied with the data voltage generates an electric field in the liquid crystal layer 3, along with the common electrode 270 applied with the common voltage.

According to an exemplary embodiment of the liquid crystal display, the first passivation layer 180a and the second passivation layer 180b includes an inorganic insulating material.

In such an embodiment, the thickness of the first passivation layer 180a disposed between the data lines 171a and 171b and the pixel electrode 191 is greater than the thickness of the second passivation layer 180b. In such an embodiment, the first passivation layer 180a has a relatively thick thickness, such that the coupling between the data lines 171a and 171b and the pixel electrode 191 is substantially reduced.

In a conventional liquid crystal display, as described above, the coupling between data lines and a pixel electrode is typically reduced by a passivation layer provided therebetween as an organic film. In such a conventional liquid crystal display, the manufacturing cost is relatively high, an aperture ratio of the liquid crystal display may be relatively low, and an additional process may be performed to remove the organic film from a driving unit thereof.

In an exemplary embodiment of the liquid crystal display of the invention, the first passivation layer 180a including the inorganic insulating material is disposed between the data lines 171a and 171b and the pixel electrode 191 which is a field generating electrode, thereby reducing the coupling between the data lines 171a and 171b and the pixel electrode 191 while reducing the manufacturing cost and effectively preventing the aperture ratio of the liquid crystal display from being decreased.

In such an embodiment, the second passivation layer 180b, which is disposed between the pixel electrode 191 and the common electrode 270, which are the two field generating electrodes, has a thin thickness, thereby increasing the difference in voltage between the pixel electrode 191 and the common electrode 270 with the data voltage having a relatively low magnitude, which is applied to the pixel electrode 191, such that the liquid crystal display is effectively prevented from being damaged due to heat which may occur by a data voltage having high magnitude, and manufacturing cost of the driving unit is substantially reduced.

In such an embodiment of the liquid crystal display according to the invention, the common electrode 270 is disposed over substantially an entire surface of the first insulating substrate 110. Therefore, the overlapping area between the common electrode 270 and the pixel electrode 191 increases, thereby increasing the maintenance capacitance of the liquid crystal display, such that the kickback voltage of the liquid crystal display may be reduced. In such an embodiment, where the common electrode 270 is disposed over substantially an entire surface of the first insulating substrate 110, an effect due to the difference in the overlapping area between the data lines 171 and 171b and the pixel electrode 191, e.g., the coupling change which may occur due to the difference in the overlapping area between the data lines 171a and 171b and the pixel electrode 191, is effectively prevented such that an image quality is substantially improved.

Next, the upper panel 200 will be described. The light blocking member 220 is disposed on the second insulating substrate 210 of the upper panel 200. The color filters 230 are disposed on the substrate 210. The color filter 230 may covers substantially an entire region enclosed by the light blocking member 220.

The overcoat 250 is disposed on the color filter 230 and the light blocking member 220. In an alternative exemplary embodiment, the overcoat 250 may be omitted.

The spacer 325 is disposed between the lower panel 100 and the upper panel 200 at a portion of the extensions 135 of the common voltage line 131.

The contact hole 184 for electrically connecting between the common voltage line 131 and the common electrode 270 is not defined on a portion of the extensions 135 of the common voltage line 131 overlapping the spacer 325.

In such an embodiment, other features of the liquid crystal display are substantially the same as corresponding features of the exemplary embodiments described with reference to FIGS. 2 to 7.

Figure 10:
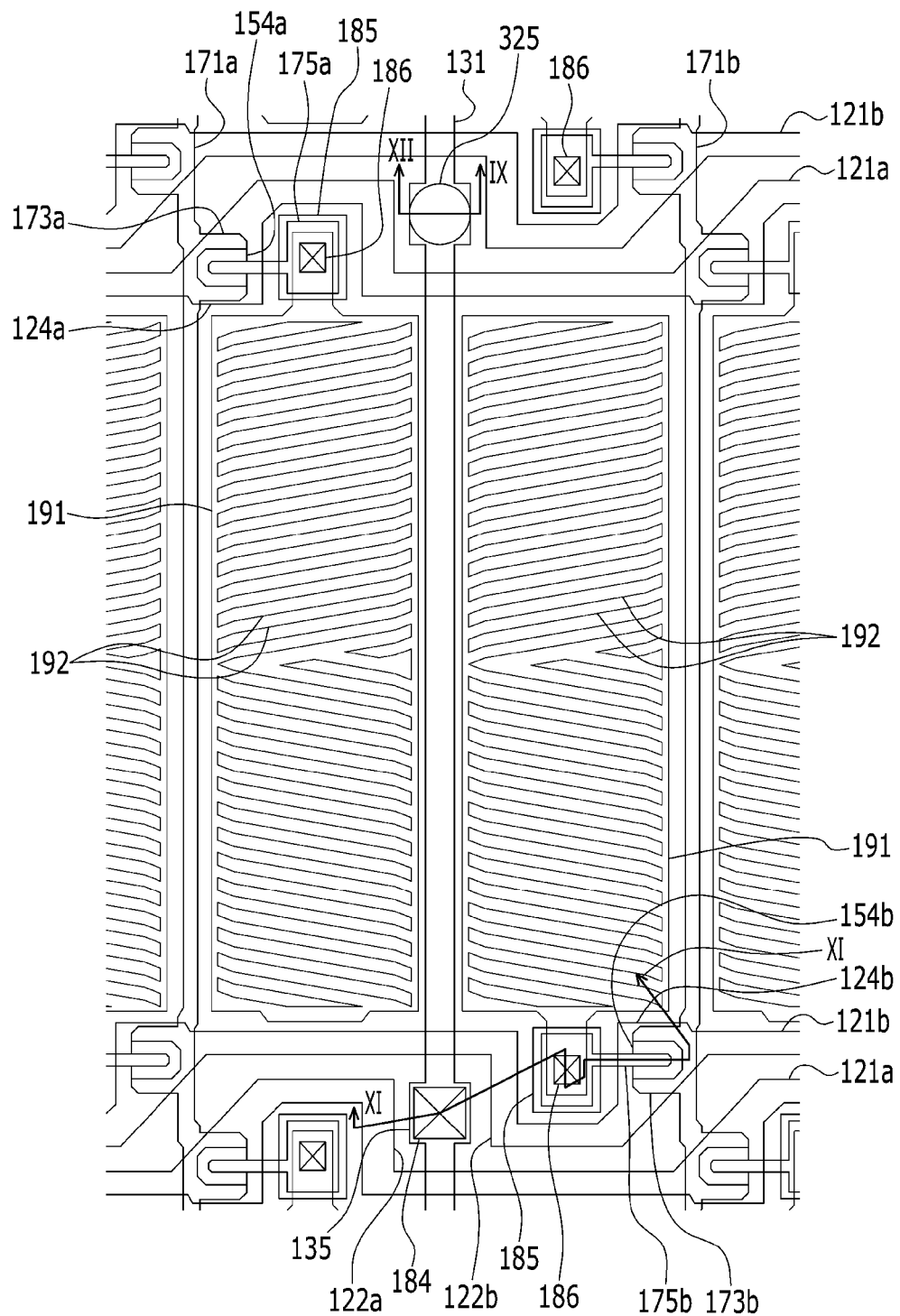
FIG. 10 is a plan view of a portion of pixels of another alternative exemplary embodiment of a liquid crystal display according to the invention.

Next, another alternative exemplary embodiment of a liquid crystal display according to the invention will be described with reference to FIGS. 10 and 12. FIG. 10 is a plan view of a portion of pixels of another alternative exemplary embodiment of a liquid crystal display according to the invention, FIG. 11 is a cross-sectional view taken along line XI-XI of the liquid crystal display of FIG. 10, and FIG. 12 is a cross-sectional view taken along line XII-XII of the liquid crystal display of FIG. 10.

Figure 11:
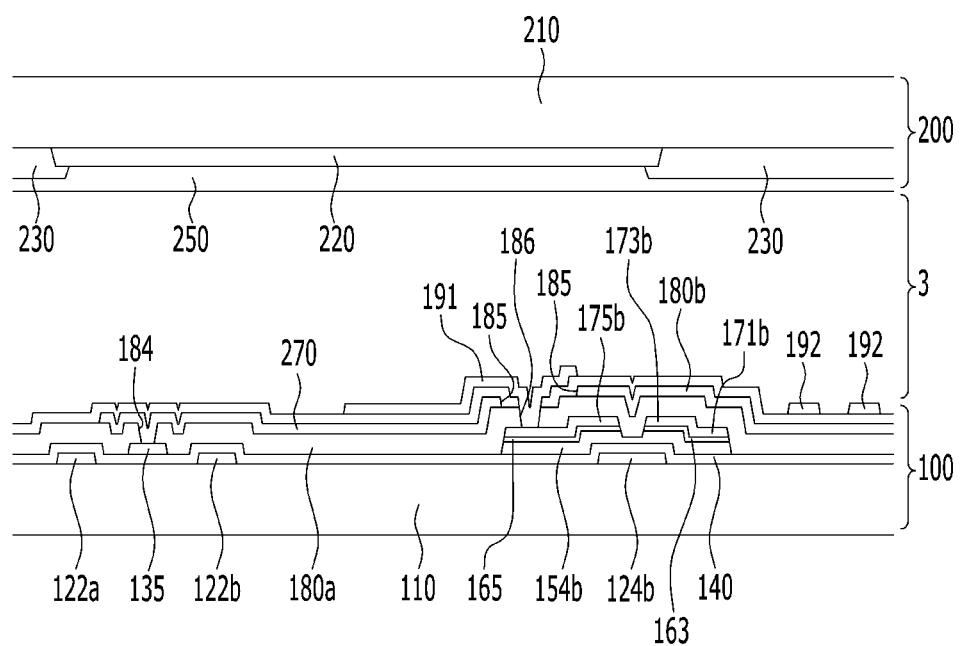
FIG. 11 is a cross-sectional view taken along line XI-XI of the liquid crystal display of FIG. 10.
Figure 12:
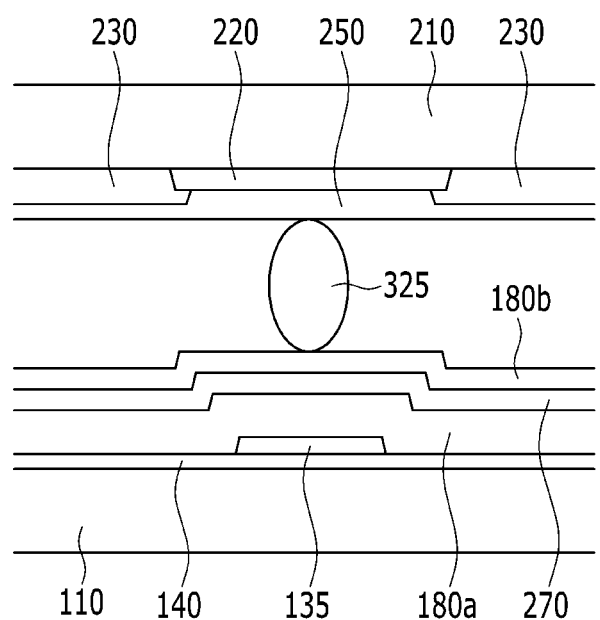
FIG. 12 is a cross-sectional view taken along line XII-XII of the liquid crystal display of FIG. 10.

The liquid crystal display shown in FIGS. 10 to 12 is substantially similar to the exemplary embodiment of the liquid crystal display according to the invention described with reference to FIGS. 2 to 4. The same or like elements shown in FIGS. 10 to 12 have been labeled with the same reference characters as used above to describe the exemplary embodiments of the liquid crystal display in FIGS. 2 to 4, and any repetitive detailed description thereof may be omitted or simplified.

Referring to FIGS. 10 to 12, another alternative exemplary embodiment of the liquid crystal display according to the invention includes the lower panel 100 and the upper panel 200 opposite to each other and the liquid crystal layer 3 interposed between the lower and upper panels 100 and 200.

The lower panel 100 will be described.

The gate lines 121a and 121b is disposed on the first insulating substrate 110. The gate lines 121a and 121b are disposed in a pixel row, and includes the first gate line 121a disposed at an upper portion of the pixel row and the second gate line 121b disposed at a lower portion of the pixel row. The first gate line 121a is disposed adjacent to the second gate line 121b of the previous pixel row, and the second gate line 121b is disposed adjacent to the first gate line 121a of the next pixel row. In such an embodiment, the first gate line 121a and the second gate line 121b which are connected to a current pixel row neighbor the second gate line 121b of a previous pixel row and the first gate line 121a of a next pixel row, respectively.

The first gate line 121a includes the first gate electrode 124a, and the second gate line 121b includes the second gate electrode 124b. The first gate line 121a includes the first vertical part 122a, and the second gate line 121b includes the second vertical part 122b.

The gate insulating layer 140 is disposed on the gate lines 121a and 121b.

The first semiconductor 154a and the second semiconductor 154b are disposed on the gate insulating layer 140. The ohmic contacts 163 and 165 are disposed on the semiconductors 154a and 154b.

The data conductors including the data lines 171a and 171b, the drain electrodes 175a and 175b, and the common voltage lines 131 are disposed on the ohmic contacts 163 and 165.

The data lines 171a and 171b transfer the data signals and extend substantially in a vertical direction crossing the gate lines 121a and 121b. The data lines 171a and 171b include the first data line 171a and the second data line 171b, between which two adjacent pixel columns are disposed.

The data lines 171a and 171b extend substantially linearly in a predetermined direction.

Each of the data lines 171a and 171b is disposed between two adjacent pixel columns, each of the data lines 171a and 171b is alternately connected to the pixel electrodes 191 of the pixels of two adjacent pixel columns, e.g., alternately connected to the pixel electrodes 191 disposed at the left and right sides of the data lines 171a and 171b. In such an embodiment, each of the data lines 171a and 171b applies a data voltage to the two pixel electrodes 191 of the two adjacent pixel columns, thereby reducing the number of the data lines 171a and 171b by half the number of the pixel columns. Therefore, in such an embodiment, the manufacturing cost of the liquid crystal display may be reduced.

The first data line 171a includes the first source electrode 173a which extends toward the first gate electrode 124a, and the second data line 171b includes the second source electrode 173b which extends toward the second gate electrode 124b.

The first drain electrode 175a includes one end facing the first source electrode 173a based on the first gate electrode 124a and the other end having a wide area.

The second drain electrode 175b includes one end facing the second source electrode 173b based on the second gate electrode 124b and the other end having a wide area.

The common voltage line 131 is disposed between the two data lines 171a and 171b and extends substantially parallel to the data lines 171a and 171b. The common voltage line 131 extends substantially linearly in a predetermined direction. In such an embodiment, an extending direction of the common voltage line 131 may be substantially parallel to an extending direction of the data lines 171a and 171b The extension 135 of the common voltage line 131 is disposed between the vertical parts 122a and 122b of the first gate line 121a and the second gate line 121b.

In such an embodiment, an area occupied by the gate lines 121a and 121b and the extension 135 of the common voltage line 131 is substantially reduced by providing, e.g., disposing the extension 135 of the common voltage line 131 between the vertical parts 122a and 122b of the first gate line 121a and the second gate line 121b.

A portion of the extensions 135 of the common voltage line 131 overlaps a contact hole 184 defined in or through the first passivation layer 180a and the second passivation layer 180b and a portion of the extensions 135 overlaps the spacer 325.

The first passivation layer 180a is disposed on the data conductors 171a, 171b, 175a, 175b and 131 and the exposed portion of the semiconductors 154a and 154b. The common electrode 270 is disposed on the first passivation layer 180a. The common electrode 270 may have a planar shape, e.g., a plate-like shape and the common electrode 270 in a pixel area may be connected to the common electrode 270 in the adjacent pixel area. The common electrode 270 may have the aperture region 185 which is disposed on the drain electrodes 175a and 175b.

The second passivation layer 180b is disposed on the common electrode 270.

The pixel electrode 191 is disposed on the second passivation layer 180b. The pixel electrode 191 includes the branch electrodes 192. The branch electrodes 192 of the pixel electrode 191 forms a predetermined angle with the gate lines 121a and 121b and extends substantially in a direction in which the gate lines 121a and 121b extend.

In such an embodiment, as described above, a contact hole (hereinafter, a second contact hole) 184 which exposes an extension 135 of the common voltage line 131 is defined in or through the first passivation layer 180a.

The common electrode 270 is connected to the extension 135 of the common voltage line 131 through the second contact hole 184.

A contact hole (also referred to as a first contact hole) 186 is defined in or through the first passivation layer 180a and the second passivation layer 180b.

The first contact hole 186 is defined within the aperture region 185 of the common electrode 270.

The pixel electrode 191 contacts the drain electrodes 175a and 175b through the first contact hole 186 in the first passivation layer 180a and the second passivation layer 180b.

The pixel electrode 191 applied with the data voltage generates an electric field in the liquid crystal layer 3, along with the common electrode 270 applied with the common voltage.

In an exemplary embodiment, as shown in FIG. 11, the thickness of the first passivation layer 180a disposed between the data lines 171a and 171b and the common electrode 270 is greater than the thickness of the second passivation layer 180b. In such an embodiment, the first passivation layer 180a has a relatively thick thickness, such that the coupling between the data lines 171a and 171b and the common electrode 270 is substantially reduced.

In a conventional liquid crystal display, as described above, the coupling between data lines and a pixel electrode is typically reduced by a passivation layer provided therebetween as an organic film. In such a conventional liquid crystal display, the manufacturing cost is relatively high, an aperture ratio of the liquid crystal display may be relatively low, and an additional process may be performed to remove the organic film from a driving unit thereof.

In an exemplary embodiment of the liquid crystal display of the invention, the first passivation layer 180a including the inorganic insulating material is disposed between the data lines 171a and 171b and the pixel electrode 191 which is a field generating electrode, thereby substantially reducing the coupling between the data lines 171a and 171b and the common electrode 270 and the pixel electrode 191 while reducing the manufacturing cost and effectively preventing the aperture ratio of the liquid crystal display from being decreased.

In an exemplary embodiment, the second passivation layer 180b, which is disposed between the pixel electrode 191 and the common electrode 270, which are the two field generating electrodes, has a thin thickness, thereby increasing the difference in voltage between the pixel electrode 191 and the common electrode 270 with the data voltage having a relatively low magnitude, which is applied to the pixel electrode 191, such that the liquid crystal display is effectively prevented from being damaged due to heat which may occur by a data voltage having high magnitude, and manufacturing cost of the driving unit is substantially reduced.

In such an embodiment of the liquid crystal display according to the invention, the common electrode 270 is disposed over substantially an entire surface of the first insulating substrate 110. Therefore, the overlapping area between the common electrode 270 and the pixel electrode 191 increases, thereby increasing the maintenance capacitance of the liquid crystal display, such that the kickback voltage of the liquid crystal display may be reduced. In such an embodiment, where the common electrode 270 is disposed over substantially an entire surface of the first insulating substrate 110, an effect due to the difference in the overlapping area between the data lines 171 and 171b and the pixel electrode 191, e.g., the coupling change which may occur due to the difference in the overlapping area between the data lines 171a and 171b and the pixel electrode 191, is effectively prevented such that an image quality is substantially improved.

Next, the upper panel 200 will be described. The light blocking member 220 is disposed on the second insulating substrate 210. The color filters 230 are disposed on the second insulating substrate 210. The color filter 230 may cover substantially an entire region enclosed by the light blocking member 220.

The overcoat 250 is disposed on the color filter 230 and the light blocking member 220. In an alternative exemplary embodiment, the overcoat 250 may be omitted.

The spacer 325 is disposed between the lower panel 100 and the upper panel 200. The spacer 325 is disposed at a position overlapping a portion of the extensions 135 of the common voltage line 131.

The second contact hole 184 for electrically connecting between the common voltage line 131 and the common electrode 270 is not disposed on a portion of the extensions 135 of the common voltage line 131 overlapping the spacer 325.

In such an embodiment, other features of the liquid crystal display are substantially the same as corresponding features of the exemplary embodiments described with reference to FIGS. 2 to 9.

While this invention has been described in connection with what is presently considered to be practical exemplary embodiments, it is to be understood that the invention is not limited to the exemplary embodiments described herein, but, on the contrary, is intended to cover various modifications and equivalent arrangements included within the spirit and scope of the appended claims.

What is claimed is:

1. A liquid crystal display, comprising:
    an insulating substrate;
    a plurality of gate lines disposed on the insulating substrate;
    a plurality of data lines disposed on the insulating substrate;
    a plurality of pixels disposed on the insulating substrate substantially in a matrix form comprising a plurality of pixel columns and a plurality of pixel rows;
    a common voltage line disposed on the insulating substrate wherein each data line corresponds to two adjacent pixel columns of the pixel columns,
    a spacer disposed at a position overlapping a portion of the common voltage line which extends substantially to the data lines and is disposed between two data lines of the data lines adjacent to each other,
    wherein the plurality of gate lines comprise a pair of the gate lines disposed in upper and lower portions of one pixel row of the plurality of pixel rows,
    wherein each of the plurality of data lines is disposed between two pairs of the pixel columns adjacent to each other, one pair of the two pairs of the pixel columns are disposed in the left side of the each of the plurality of data lines and the other pair of the two pairs of the pixel columns are disposed in the right side of the each of the plurality of data lines,
    wherein the each of the plurality of data lines is alternately connected to the one pair of the two pairs of the pixel columns and the other pair of the two pairs of the pixel columns, and
    wherein each pixel comprises:
    a thin film transistor connected to a corresponding gate line of the gate lines and a corresponding data line of the data lines;
    a first electrode disposed on the thin film transistor; and
    a second electrode disposed on the first electrode;
    a first insulating layer disposed on the gate lines, the data lines and the thin film transistor of each pixel, and under the first electrode of the each pixel; and
    a second insulating layer disposed between the first electrode and the second electrode of each pixel,
    wherein each of the first insulating layer and the second insulating layer comprises an inorganic insulating layer, and
    a thickness of the first insulating layer is greater than a thickness of the second insulating layer.

2. The liquid crystal display of claim 1, wherein the second electrode overlaps the corresponding data line.

3. The liquid crystal display of claim 2, wherein
    a first contact hole is defined in the second insulating layer, wherein the first contact hole exposes the first electrode of a pixel, and
    a second contact hole is defined in the first insulating layer and the second insulating layer, wherein the second contact hole exposes a drain electrode of the thin film transistor of the pixel, and
    the liquid crystal display further comprises:
    a connecting member disposed on the first contact hole and the second contact hole.

4. The liquid crystal display device of claim 3, wherein
    the first insulating layer and the second insulating layer are disposed on the common voltage line,
    a third contact hole is defined in the first insulating layer and the second insulating layer, wherein the third contact hole exposes a portion of the common voltage line, and
    the second electrode is connected to the common voltage line through the third contact hole.

5. The liquid crystal display of claim 3, wherein
    the first electrode comprises a plurality of branch electrodes, and
    the branch electrodes extend substantially parallel to the data lines.

6. The liquid crystal display of claim 3, wherein
    the first electrode comprises a plurality of branch electrodes, and
    the branch electrodes form a predetermined angle with the gate lines and extend substantially in a direction in which the gate lines extend.

7. The liquid crystal display of claim 1, wherein the first electrode overlaps the corresponding data line.

8. The liquid crystal display of claim 7, wherein
    an opening is defined in the first electrode of a pixel at a portion corresponding to a drain electrode of the thin film transistor of the pixel,
    a first contact hole is defined in the first insulating layer and the second insulating layer, wherein the first contact hole exposes a drain electrode of the thin film transistor of the pixel,
    the second electrode of the pixel is connected to the drain electrode of the pixel through the first contact hole, and
    the first contact hole is within the opening.

9. The liquid crystal display of claim 8, further comprising:
    a common voltage line disposed on the insulating substrate,
    wherein each data line corresponds to two adjacent pixel columns of the pixel columns, and
    the common voltage line extends substantially parallel to the data lines and is disposed between two data lines adjacent to each other.

10. The liquid crystal display of claim 9, wherein
    the first insulating layer and the second insulating layer are disposed on the common voltage line,
    a second contact hole is defined in the first insulating layer, wherein the second contact hole exposes a portion of the common voltage line, and
    the first electrode is connected to the common voltage line through the second contact hole.

11. The liquid crystal display of claim 8, wherein
    the second electrode includes a plurality of branch electrodes, and the branch electrodes extend substantially parallel to the data lines.

12. The liquid crystal display of claim 8, wherein the second electrode includes a plurality of branch electrodes, and the branch electrodes form a predetermined angle with the gate lines and extend substantially in a direction in which the gate lines extend.

\* \* \* \* \*